US012368074B2

(12) United States Patent
Li et al.

(10) Patent No.: US 12,368,074 B2
(45) Date of Patent: Jul. 22, 2025

(54) MANUFACTURING METHOD OF SEMICONDUCTOR STRUCTURE COMPRISING A GAP AND SEMICONDUCTOR STRUCTURE COMPRISING A GAP

(71) Applicant: CHANGXIN MEMORY TECHNOLOGIES, INC., Hefei (CN)

(72) Inventors: Ting Li, Hefei (CN); Hou-Hong Chou, Hefei (CN)

(73) Assignee: CHANGXI MEMORY TECHNOLOGIES, INC., Hefei (CN)

( * ) Notice: Subject to any disclaimer, the term of this patent is extended or adjusted under 35 U.S.C. 154(b) by 754 days.

(21) Appl. No.: 17/648,952

(22) Filed: Jan. 26, 2022

(65) Prior Publication Data

US 2022/0216100 A1  Jul. 7, 2022

Related U.S. Application Data

(63) Continuation of application No. PCT/CN2021/112770, filed on Aug. 16, 2021.

(30) Foreign Application Priority Data

Jan. 4, 2021 (CN) .......................... 202110003495.3

(51) Int. Cl.
  *H01L 21/768* (2006.01)
  *H01L 21/02* (2006.01)
  (Continued)

(52) U.S. Cl.
  CPC .... *H01L 21/76832* (2013.01); *H01L 21/7682* (2013.01); *H01L 21/76831* (2013.01);
  (Continued)

(58) Field of Classification Search
  CPC ........... H01L 21/76832; H01L 21/7682; H01L 21/76831
  See application file for complete search history.

(56) References Cited

U.S. PATENT DOCUMENTS 10,505,111 B1    12/2019  Ok et al.
2008/0124912 A1*  5/2008  Liu .................. H01L 21/02274
                                                   438/622
(Continued)

FOREIGN PATENT DOCUMENTS

CN    101425500 A    5/2009
CN    102760683 A    10/2012
(Continued)

OTHER PUBLICATIONS

Extended European Search Report in application No. 21913115, mailed on May 23, 2024.
(Continued)

*Primary Examiner* — Xia L Cross
*Assistant Examiner* — Bruce R. Smith, III
(74) *Attorney, Agent, or Firm* — Syncoda LLC; Feng Ma (57) ABSTRACT

Embodiments of the present application provide a manufacturing method of a semiconductor structure and a semiconductor structure. The manufacturing method includes: providing a base with an electrical contact layer therein; forming an insulating layer on the base, the insulating layer having a through hole penetrating the insulating layer, and the through hole exposing a surface of the electrical contact layer; forming a sidewall layer on a sidewall of the through hole; forming a first isolation layer, the first isolation layer covering a surface of the sidewall layer and an exposed surface of the insulating layer; removing the sidewall layer to form a gap between the first isolation layer and the insulating layer; and forming a conducting layer filling the
(Continued)

through hole, the conducting layer being electrically connected to the electrical contact layer.

10 Claims, 6 Drawing Sheets

(51) Int. Cl.
    *H01L 21/311*     (2006.01)
    *H01L 23/522*     (2006.01)
    *H01L 23/532*     (2006.01)

(52) U.S. Cl.
    CPC .. *H01L 23/53295* (2013.01); *H01L 21/02126* (2013.01); *H01L 21/02164* (2013.01); *H01L 21/0228* (2013.01); *H01L 21/31122* (2013.01); *H01L 21/31138* (2013.01); *H01L 21/76843* (2013.01); *H01L 23/5226* (2013.01)

(56) References Cited

U.S. PATENT DOCUMENTS

| | | | |
|---|---|---|---|
| 2012/0153500 A1* | 6/2012 | Kim | H01L 21/76898 438/653 |
| 2014/0264729 A1* | 9/2014 | Lee | H01L 21/76805 257/522 |
| 2014/0306351 A1* | 10/2014 | Kim | H01L 21/76831 438/653 |
| 2015/0035050 A1 | 2/2015 | Yeom et al. | |
| 2015/0228754 A1 | 8/2015 | Sung | |
| 2019/0221475 A1 | 7/2019 | Hong et al. | |
| 2022/0189818 A1* | 6/2022 | Al-Amoody | H01L 23/485 |

FOREIGN PATENT DOCUMENTS

| | | |
|---|---|---|
| CN | 103094190 A | 5/2013 |
| CN | 109390402 A | 2/2019 |
| CN | 110880476 A | 3/2020 |
| CN | 110911370 A | 3/2020 |

OTHER PUBLICATIONS

International Search Report as cited in PCT/CN2021/112770 mailed Oct. 11, 2021, 9 pages.

* cited by examiner

MANUFACTURING METHOD OF SEMICONDUCTOR STRUCTURE COMPRISING A GAP AND SEMICONDUCTOR STRUCTURE COMPRISING A GAP

CROSS-REFERENCE TO RELATED APPLICATIONS

This application is a continuation application of International Patent Application No. PCT/CN2021/112770, which claims priority to Chinese Patent Application No. 202110003495.3, filed with the Chinese Patent Office on Jan. 4, 2021 and entitled "MANUFACTURING METHOD OF SEMICONDUCTOR STRUCTURE AND SEMICONDUCTOR STRUCTURE." International Patent Application No. PCT/CN2021/112770 and Chinese Patent Application No. 202110003495.3 are incorporated herein by reference in their entireties.

TECHNICAL FIELD

Embodiments of the present disclosure relate to the field of semiconductors, and in particular to a manufacturing method of a semiconductor structure and a semiconductor structure.

BACKGROUND

With the development of semiconductor manufacturing technologies, the critical dimension of the semiconductor process has shrunk to the order of deep submicron. Due to the continuous shrinking of the critical dimension, a distance between interconnection lines in a semiconductor structure is getting closer, and parasitic capacitance is getting larger and larger. The parasitic capacitance can seriously affect the performance of the semiconductor structure, and especially reduce the operating speed and reliability of the semiconductor structure.

Therefore, how to reduce the parasitic capacitance in the semiconductor structure is currently an urgent technical problem to be solved.

SUMMARY

An embodiment of the present disclosure provides a manufacturing method of a semiconductor structure, including: providing a base with an electrical contact layer therein; forming an insulating layer on the base, the insulating layer having a through hole penetrating the insulating layer, and the through hole exposing a surface of the electrical contact layer; forming a sidewall layer on a sidewall of the through hole; forming a first isolation layer, the first isolation layer covering a surface of the sidewall layer and an exposed surface of the insulating layer; removing the sidewall layer to form a gap between the first isolation layer and the insulating layer; and forming a conducting layer filling the through hole, the conducting layer being electrically connected to the electrical contact layer.

An embodiment of the present disclosure further provides a semiconductor structure, including: a base with an electrical contact layer therein; an insulating layer located on the base, the insulating layer having a conducting layer therein, and the conducting layer being electrically connected to the electrical contact layer; and a first isolation layer located between the insulating layer and the conducting layer, the first isolation layer being also located on part of the sidewall of the insulating layer, a gap existing between the insulating layer and the first isolation layer, and the first isolation layer sealing the gap.

BRIEF DESCRIPTION OF DRAWINGS

One or more embodiments are exemplified by pictures in the corresponding drawings. These exemplified descriptions do not constitute a limitation on the embodiments. Elements with the same reference numerals in the drawings are denoted as similar elements. Unless otherwise stated, the figures in the accompanying drawings do not constitute a scale limitation.

DESCRIPTION OF EMBODIMENTS

It can be seen from the Background section that the parasitic capacitance in a semiconductor structure needs to be further reduced. A method for reducing the parasitic capacitance may include: forming a sacrificial layer between a conducting layer and an insulating layer which are adjacent, removing the sacrificial layer to form a gap, and sealing the gap. Since there is air in the gap and a dielectric constant of the air is low, the parasitic capacitance can be reduced. In a process step of sealing the gap, part of reaction gas can enter the gap and form a deposition layer at a bottom of the gap, thereby reducing the size of the gap. In addition, if improper sealing occurs, during subsequent deposition of a conducting material, the conducting material is likely to enter the gap, thereby causing electrical conduction between interconnection lines that should be isolated from each other. Therefore, the above method has a poor effect of reducing parasitic capacitance, and may also affect the yield of the semiconductor structure.

Embodiments of the present disclosure provide a manufacturing method of a semiconductor structure and a semiconductor structure. The manufacturing method of a semiconductor structure includes: providing a base with an electrical contact layer therein; forming an insulating layer on the base, the insulating layer having a through hole penetrating the insulating layer, and the through hole exposing a surface of the electrical contact layer; forming a sidewall layer on a sidewall of the through hole; forming a first isolation layer, the first isolation layer covering a surface of the sidewall layer and an exposed surface of the insulating layer; removing the sidewall layer to form a gap between the first isolation layer and the insulating layer; and forming a conducting layer filling the through hole, the conducting layer being electrically connected to the electrical contact layer. Since the first isolation layer covers the entire surface of the sidewall layer, the gap formed after the removal of the sidewall layer is completely surrounded by the first isolation layer and does not need to be sealed, thereby ensuring that the parasitic capacitance can be reduced to a great extent and improving the yield of the semiconductor structure.

In order to make the objectives, technical solutions, and advantages of the embodiments of the present disclosure more clear, various embodiments of the present disclosure will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented.

FIG. 1 to FIG. 11 are schematic structural diagrams corresponding to various steps of a manufacturing method of a semiconductor structure according to a first embodiment of the present disclosure. A detailed description will be given below in conjunction with the drawings.

Figure 1:
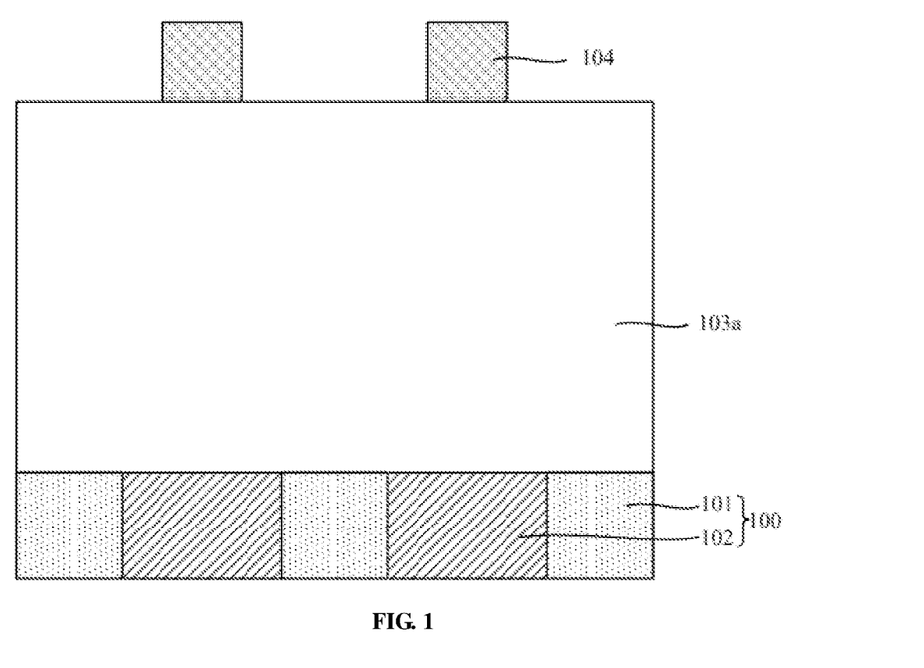
FIG. 1 to FIG. 11 are schematic structural diagrams corresponding to various steps of a manufacturing method of a semiconductor structure according to an embodiment of the present disclosure.

Referring to FIG. 1, a base 100 with an electrical contact layer 101 therein is provided. The base 100 may include structures such as wordlines, bitlines, sources, drains and the like. The base 100 may be made of silicon, sapphire, silicon carbide, gallium arsenide, aluminum nitride, zinc silicon oxide, or the like.

The electrical contact layer 101 is configured to achieve electrical connection between an internal structure of the base 100 and a conducting layer formed subsequently. In an example, the subsequently-formed conducting layer may be electrically connected to the bitlines in the base 100 through the electrical contact layer. In the present embodiment, the electrical contact layer 101 is made of copper. In other embodiments, the electrical contact layer 101 may also be made of a conducting material, such as polysilicon, tungsten, titanium, or the like.

In the present embodiment, the base 100 further has isolation structures 102 therein, and the isolation structure 102 is configured to isolate adjacent electrical contact layers 101. In the present embodiment, the isolation structure 102 is made of silicon oxide. In other embodiments, the isolation structure 102 may also be made of an insulating material such as silicon carbide, silicon nitride, or the like.

Figure 2:
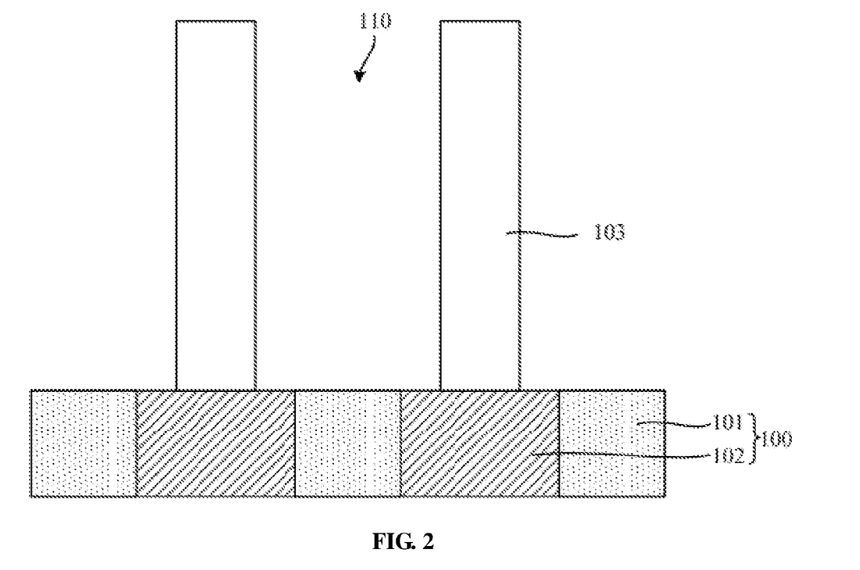

Referring to FIG. 1 to FIG. 2, an insulating layer 103 is formed on the base 100. The insulating layer 103 has a through hole 110 penetrating the insulating layer 103, and the through hole 110 exposes a surface of the electrical contact layer 101.

The insulating layer 103 is configured to isolate the conducting layer formed in the through hole 110 subsequently.

The insulating layer 103 is located on the isolation structure 102, and in a direction parallel to a surface of the base 100, the isolation structure 102 is wider than the insulating layer 103 for the following reason: a gap, a first isolation layer and a second isolation layer will be formed subsequently on a sidewall of the insulating layer 103, the isolation structure 102 is wider than the insulating layer 103, and when a width difference meets a certain value range, the gap, the first isolation layer and the second isolation layer can directly face the isolation structure 102, so that the entire surface of the electrical contact layer 101 is exposed to increase a contact area between the subsequently-formed conducting layer and the electrical contact layer 101, thereby reducing contact resistance.

A width of the insulating layer 103 is greater than or equal to one-half of a width of the isolation structure 102 and less than or equal to the width of the isolation structure 102. When the width of the insulating layer 103 is within the above range, the first and second isolation layers to be formed subsequently can be well supported and the stability of the semiconductor structure can be improved; and moreover enough space can also be reserved for the gap, the first isolation layer and the second isolation layer to be formed subsequently, so that the gap, the first isolation layer and the second isolation layer can be located on the isolation structure 102, and the entire surface of the electrical contact layer 101 can be exposed to increase the contact area between the subsequently-formed conducting layer and the electrical contact layer 101.

In the manufacturing method of a semiconductor structure according to the embodiment of the present disclosure, the first isolation layer covering the surface of the sidewall layer is formed, that is, also covers a top of the sidewall layer; after the sidewall layer is removed to form the gap, the first isolation layer completely seals the gap, and a step of sealing the gap is no longer required, thereby avoiding the formation of a deposition layer in the gap during the sealing process, or situations such as improper sealing, and then effectively reducing the parasitic capacitance of the semiconductor structure.

In the present embodiment, the insulating layer 103 and the isolation structure 102 are made of a same material, which can improve the tightness of adhesion between the insulating layer 103 and the isolation structure 102, thereby improving the stability of the semiconductor structure. For example, the insulating layer 103 and the isolation structure 102 are both made of silicon dioxide. In other embodiments, the insulating layer 103 may also be made of a different material from the isolation layer; for example, the insulating layer 103 may be made of an insulating material such as silicon carbide, silicon nitride, or the like.

In the present embodiment, the process step for forming the insulating layer 103 and the through hole 110 is as follows. Referring to FIG. 1, an initial insulating layer 103a is formed on the base 100, and a patterned photoresist layer 104 is formed on the initial insulating layer 103a; referring to FIG. 2, using the patterned photoresist layer 104 (see FIG. 1) as a mask, the initial insulating layer 103a (see FIG. 1) is etched to form the insulating layer 103.

In the present embodiment, a chemical vapor deposition process is carried out to form the initial insulating layer 103a. The chemical vapor deposition process has a high deposition rate and can shorten a process time.

In the present embodiment, a dry etching method is carried out to etch the initial insulating layer 103a until the electrical contact layer 101 is exposed, thus forming the insulating layer 103 and the through hole 110 exposing the electrical contact layer 101.

Figure 3:
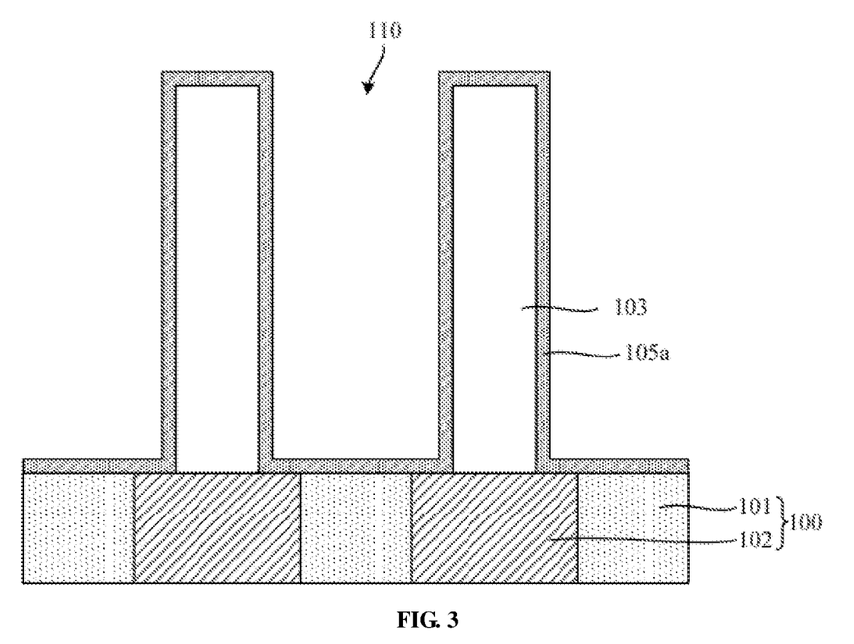
Figure 4:
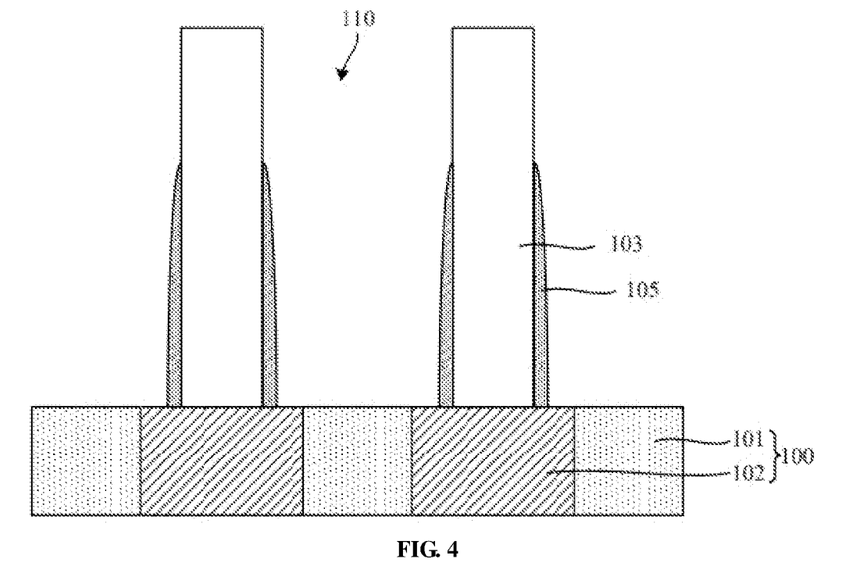

Referring to FIG. 3 to FIG. 4, a sidewall layer 105 is formed on the sidewall of the through hole 110.

The sidewall layer 105 is configured to occupy a spatial position for the subsequent formation of the gap; that is, the position of the sidewall layer 105 is the position of the subsequently-formed gap.

The sidewall layer 105 should be made of a material which can be decomposed easily. In this way, during the subsequent removal of the sidewall layer 105 to form the gap, under the action of oxygen plasma, the sidewall layer 105 can be discharged as a gas after being decomposed. The sidewall layer 105 is made of amorphous carbon, hydrocarbon or a polymer, for example, $C_xH_y$.

In the present embodiment, in a direction perpendicular to the surface of the base 100, a ratio of a height of the sidewall layer 105 to a height of the insulating layer 103 is greater than or equal to 0.3. That is, a top surface of the sidewall layer 105 may be flush with a top surface of the insulating layer 103 or may be lower than the top surface of the insulating layer 103.

When the ratio of the height of the sidewall layer 105 to the height of the insulating layer 103 is greater than or equal to 0.3, the greater the height of the sidewall layer 105, the greater the height of the gap to be formed subsequently, so that the parasitic capacitance can be reduced to a great extent.

Preferably, the top surface of the sidewall layer 105 is lower than the top surface of the insulating layer 103, and the ratio of the height of the sidewall layer 105 to the height of the insulating layer 103 is less than or equal to 0.8. In this way, the subsequently-formed first isolation layer can be located on the sidewall of the insulating layer 103 exposed by the sidewall layer 105; that is, the subsequently-formed first isolation layer can be well supported by the sidewall of the insulating layer 103, so that the first isolation layer is not likely to collapse and has a good stability.

The step of forming the sidewall layer 105 will be described in detail below.

Referring to FIG. 3, an initial sidewall layer 105a is formed on a surface of the insulating layer 103 and a bottom of the through hole 110. In the present embodiment, an atomic layer deposition process is carried out to form the initial sidewall layer 105a. The initial sidewall layer 105a formed by the atomic layer deposition process has a relatively even thickness. In other embodiments, a chemical vapor deposition process or a physical vapor deposition process may also be carried out to form the initial sidewall layer 105a.

Referring to FIG. 4, the initial sidewall layer 105a located at the bottom of the through hole 110 and the top surface of the insulating layer 103 is removed (see FIG. 3), and part of the initial sidewall layer 105a located on the sidewall of the through hole 110 is also removed; the remaining initial sidewall layer 105a serves as the sidewall layer 105a.

That is, the top surface of the sidewall layer 105 is lower than the top surface of the insulating layer 103, so that the first isolation layer formed subsequently also covers the sidewall of the insulating layer 103 exposed by the sidewall layer 105. In this way, after the sidewall layer 105 is removed, since the first isolation layer is still supported by the sidewall of the insulating layer 103, the first isolation layer has the good stability.

In other embodiments, the initial sidewall layer 105a located on the sidewall of the through hole 110 may not be removed; that is, the top surface of the formed sidewall layer 105 is flush with the top surface of the insulating layer 103, and the first isolation layer formed subsequently can not cover the sidewall of the insulating layer 103.

In the present embodiment, part of the initial insulating layer 105a is removed by dry etching (see FIG. 3).

Figure 5:
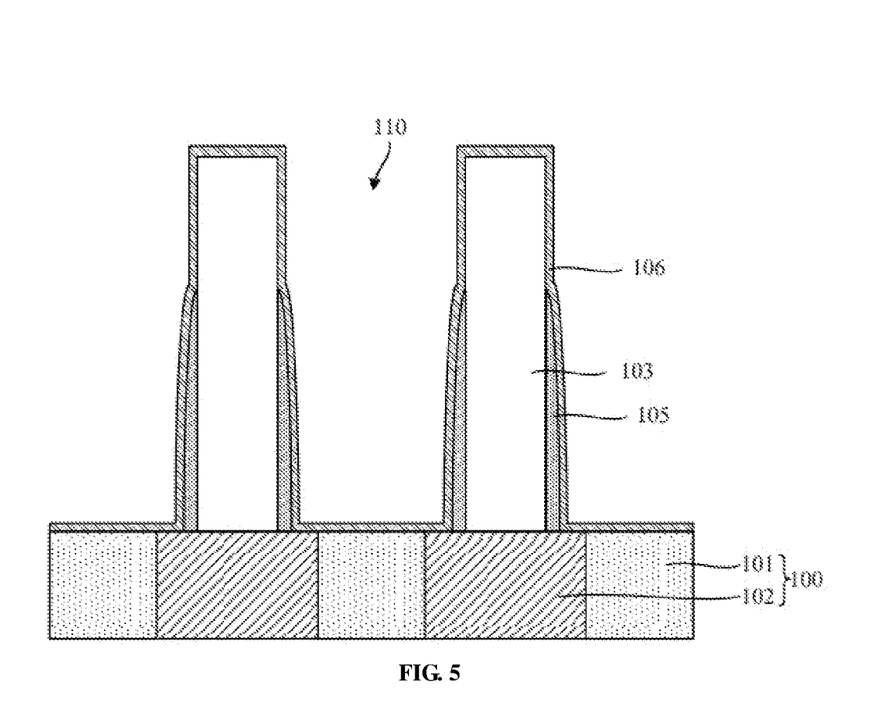

Referring to FIG. 5, a first isolation layer 106 is formed, and the first isolation layer 106 covers the surface of the sidewall layer 105 and an exposed surface of the insulating layer 103.

Compared with the sidewall layer 105, the first isolation layer 106 is required to be decomposed hardly. Therefore, the first isolation layer 106 is unlikely to be damaged during the subsequent removal of the sidewall layer 105 and thus achieves a better stability.

In addition, the first isolation layer 106 is relatively thin; for example, the thickness thereof may be less than 3 nm, so that an ion beam can more easily pass through the first isolation layer 106 and remove the sidewall layer 105.

In addition, the first isolation layer 106 has holes, so that the ion beam can directly pass through the holes, and therefore the sidewall layer 105 can be removed more thoroughly.

In the present embodiment, the first isolation layer 106 is made of silicon dioxide. In other embodiments, the first isolation layer 106 may also be made of a silicon-oxyhydrocarbon. The silicon dioxide or silicon-oxyhydrocarbon is hardly decomposed under the action of oxygen plasma and has the good stability.

In the present embodiment, the first isolation layer 106 is formed by a low-temperature atomic layer deposition process. In this way, a thin first isolation layer 106 can be formed, so that the sidewall layer 105 completely covered by the first isolation layer 106 can be more easily removed later. A temperature range of the low-temperature atomic layer deposition process is in a low-temperature range of 50° C. to 135° C. Through the low-temperature atomic layer deposition process, the thickness of the first isolation layer 106 can be more accurately controlled to obtain a homogeneous thin first isolation layer 106, and the first isolation layer 106 can have the characteristics of a flatter surface.

Figure 6:
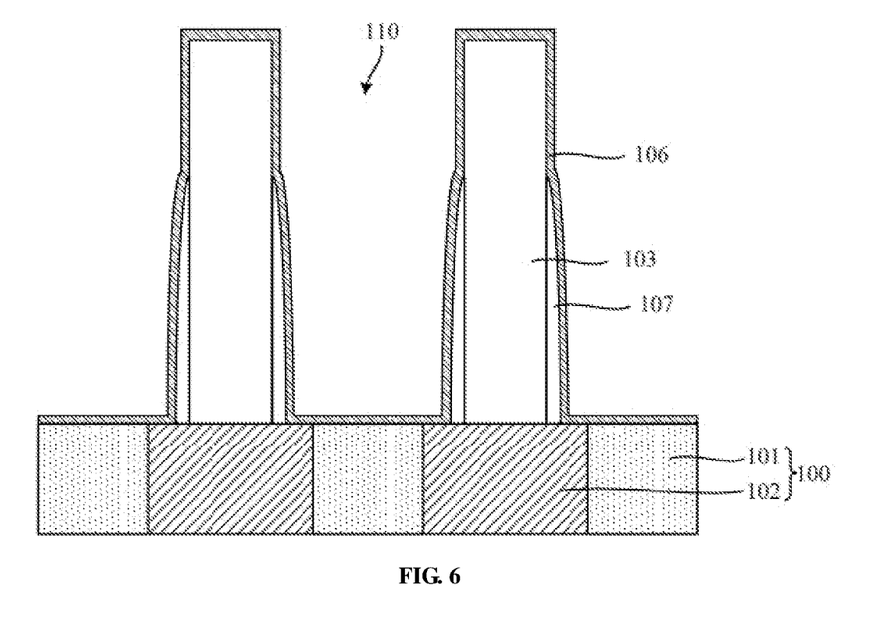

Referring to FIG. 6, the sidewall layer 105 is removed (see FIG. 5) to form a gap 107 between the first isolation layer 106 and the insulating layer 103.

A method for removing the sidewall layer 105 (see FIG. 5) includes: providing a plasma source, causing an ion beam generated by the plasma source to react with the sidewall layer 105 after passing through the first isolation layer 106 and form reaction byproducts, and discharging at least part of the reaction byproducts through the first isolation layer 106. Compared with a wet process, the above method has the advantages of fewer residues and higher cleanliness when used for removing the sidewall layer 105.

In the present embodiment, oxygen is used as the plasma source, and the process steps for removing the sidewall layer 105 include: generating an ion beam based on the oxygen plasma source, and causing the ion beam to pass through the first isolation layer 106 through the holes in the first isolation layer 106 and react with the sidewall layer 105 (see FIG. 5), so that the sidewall layer 105 is thermally decomposed to produce reaction byproducts such as carbon dioxide, carbon monoxide, water, methane and the like. Gases such as carbon dioxide, carbon monoxide, water and methane can pass through the holes in the first isolation layer 106 to be discharged.

A flow rate of oxygen is within a range of 100 sccm to 600 sccm. When the flow rate of oxygen is within the above range, oxygen can react sufficiently with the material of the sidewall layer 105, so that the sidewall layer 105 can be more completely removed; and the first isolation layer 106 can be prevented from major damage, thus ensuring that the first isolation layer 106 has a high stability.

A radio frequency power is within a range of 500 W to 1000 W. When the radio frequency power is within the above range, the ion beam has sufficient energy to completely remove the sidewall layer 105; and major damage to the first isolation layer 106 can also be prevented, ensuring that the first isolation layer 106 has a high stability.

Figure 7:
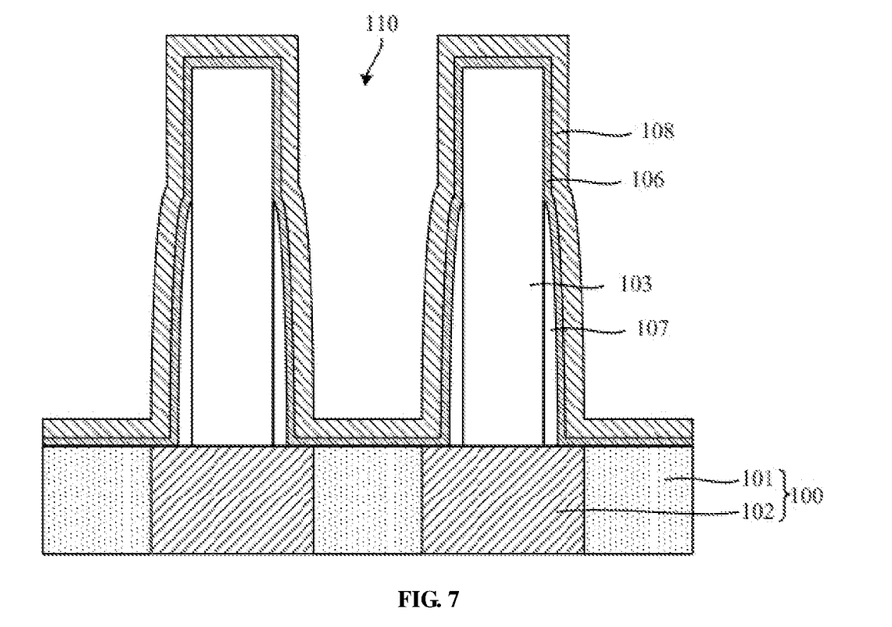

Referring to FIG. 7, a second isolation layer 108 is formed on the surface of the first isolation layer 106. A density of the second isolation layer 108 is greater than that of the first isolation layer 106.

It can be understood that, in order to make more ion beams pass through the first isolation layer 106, so that the sidewall layer 105 is removed more completely, and the first isolation layer 106 has a lower density; after the removal of the sidewall layer 105, formation of the denser second isolation layer 108 on the surface of the first isolation layer 106 can increase the density of the first isolation layer 106, thereby improving the firmness and stability of the first isolation layer 106.

The thickness of the second isolation layer 108 is greater than the thickness of the first isolation layer 106, which can further improve the firmness of the first isolation layer 106. Preferably, a ratio of the thickness of the second isolation layer 108 to the thickness of the first isolation layer 106 is within a range of 1.5:1 to 3:1. When the ratio of the thickness of the second isolation layer 108 to the thickness of the first isolation layer 106 is within the above range, the second isolation layer 108 can well reinforce the first isolation layer 106. In addition, the second isolation layer 108 can occupy a reasonable area on the isolation structure 102, so that the second isolation layer 108 can completely expose the surface of the electrical contact layer 101, so as to increase the contact area between the electrical contact layer 101 and the subsequently-formed conducting layer.

In the present embodiment, the second isolation layer 108 and the first isolation layer 106 are made of a same material, which can ensure that the second isolation layer 108 and the first isolation layer 106 can be more closely attached, thereby further improving the reinforcement effect of the second isolation layer 108. For example, the second isolation layer 108 and the first isolation layer 106 are both made of silicon dioxide. In other embodiments, the second isolation layer 108 may also be made of a different material from the first isolation layer 106; for example, the second isolation layer 108 may be made of silicon nitride.

The second isolation layer 108 is formed by an atomic layer deposition process or a chemical vapor deposition process with better step coverage.

Figure 8:
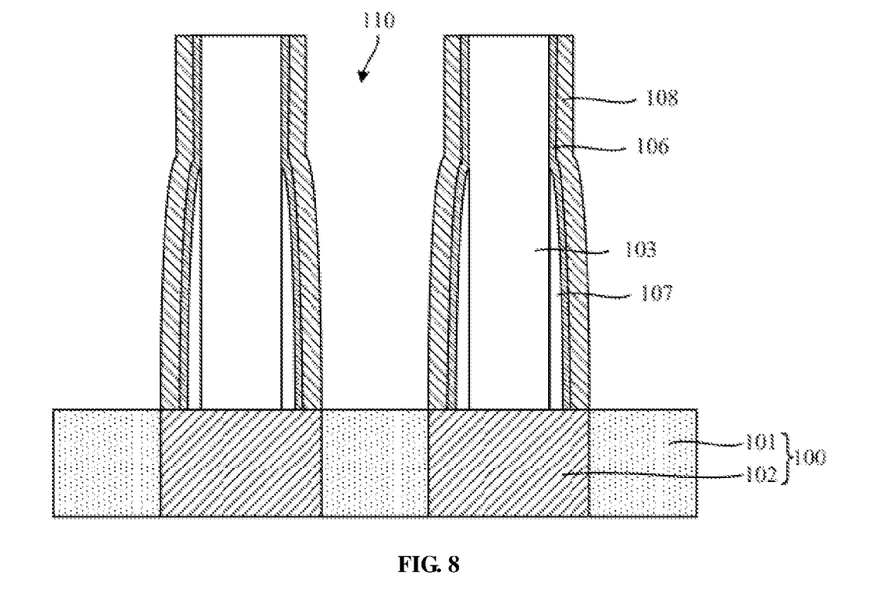

Referring to FIG. 8, the first isolation layer 106 and the second isolation layer 108 located at the bottom of the through hole 110 and the top surface of the insulating layer 103 are removed.

In the present embodiment, a dry etching method is carried out to remove part of the first isolation layer 106 and part of the second isolation layer 108.

After the removal of the part of the first isolation layer 106 and the part of the second isolation layer 108, the remaining first isolation layer 106 and the remaining second isolation layer 108 expose the entire surface of the electrical contact layer 101, thereby increasing the contact area between the subsequently-formed conducting layer and the electrical contact layer 101 and reducing the contact resistance.

In other embodiments, the remaining first isolation layer 106 and the remaining second isolation layer 108 may also expose only part of the surface of the electrical contact layer 101.

Figure 9:
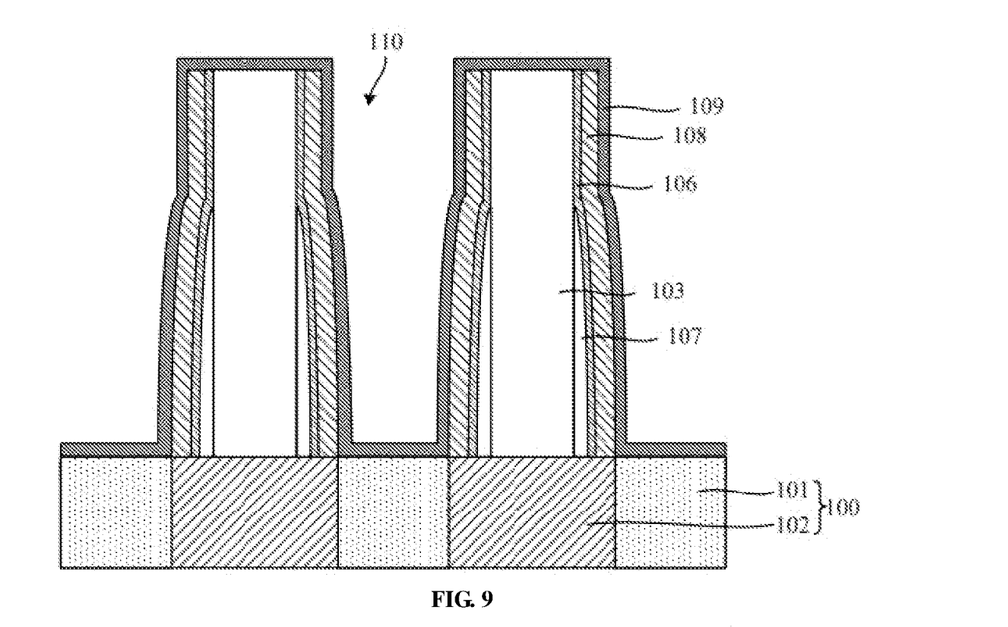

Referring to FIG. 9, a barrier layer 109 covering the sidewall of the through hole 110 is deposited.

The barrier layer 109 is configured to block mutual diffusion between atoms in the subsequently-formed conducting layer and atoms in the second isolation layer 108, and meanwhile can also increase the adhesion between the conducting layer and the second isolation layer 108, thereby improving the stability and firmness of the subsequently-formed conducting layer.

In the present embodiment, the barrier layer 109 is also located at the bottom of the through hole 110. The barrier layer 109 can also block the mutual diffusion between the atoms in the subsequently-formed conducting layer and atoms in the electrical contact layer 101, and meanwhile can also increase the adhesion between the conducting layer and the electrical contact layer 101.

The barrier layer 109 is made of tantalum, tantalum nitride, ruthenium, or rhenium.

In the present embodiment, the barrier layer 109 is formed by an atomic layer deposition process.

Figure 10:
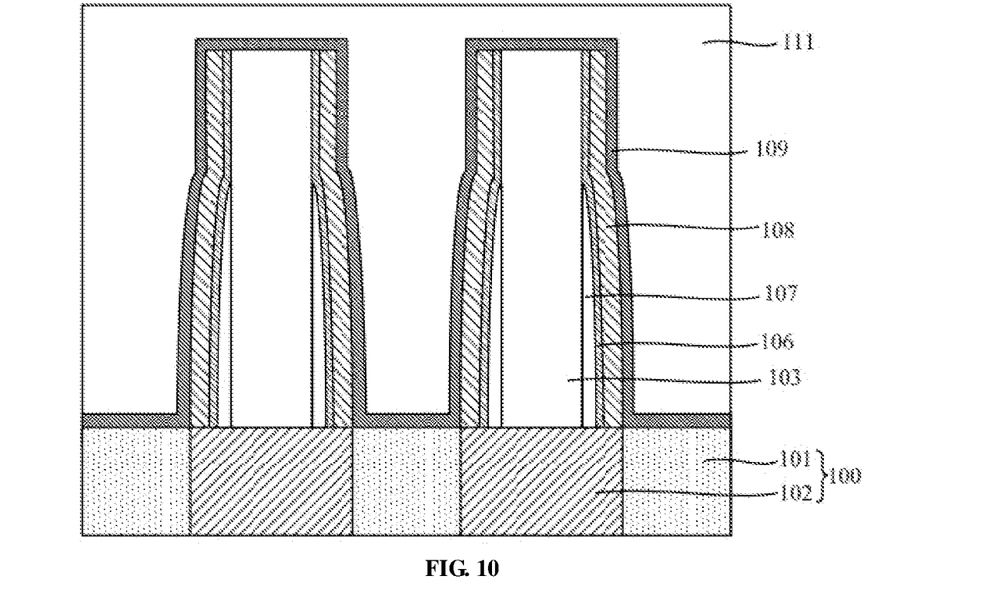

Referring to FIG. 10, a conducting layer 111 filling the through hole 110 (see FIG. 9) is formed, and the conducting layer 111 is electrically connected to the electrical contact layer 101. The conducting layer 111 is also higher than the top of the insulating layer 103.

As an interconnection line in the semiconductor structure, the conducting layer 111 connects the structures in the base 100 together according to design requirements to achieve specific functions.

In the present embodiment, the conducting layer 111 is made of copper, gold, silver, titanium or tungsten.

In the present embodiment, the conducting layer 111 is formed by a chemical vapor deposition process. In other embodiments, a physical vapor deposition process may also be carried out to form the conducting layer 111.

Figure 11:
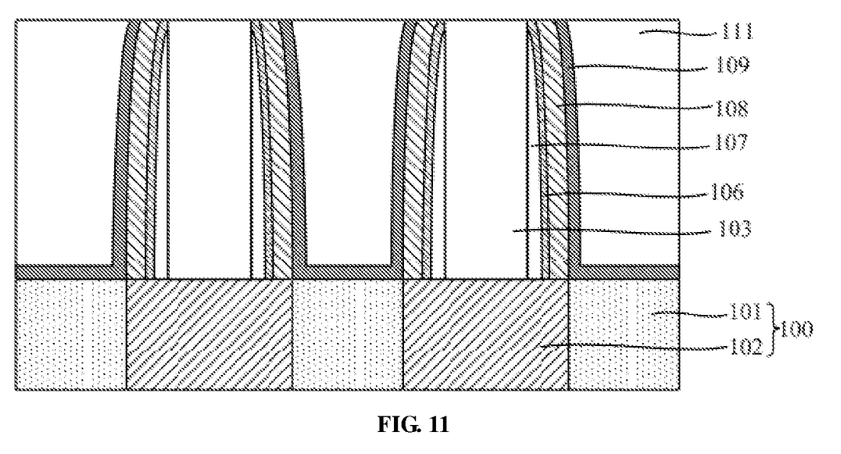

Referring to FIG. 11, planarization is performed to remove part of the conducting layer 111, part of the insulating layer 103, part of the first isolation layer 106 and part of the second isolation layer 108 which are higher than the gap 107.

It should be noted that during the planarization, the process should be stopped at a position higher than the gap 107, so as to ensure that the gap 107 is still in a sealed state.

In the present embodiment, the planarization is performed by chemical mechanical polishing.

In other embodiments, if the gap formed is located on the entire sidewall of the insulating layer 103; that is, in a direction perpendicular to the surface of the base 100, the gap is as high as the insulating layer 103; then, during the planarization, in order to ensure the tightness of the gap, only the conducting layer 111 higher than the gap may be removed, while the insulating layer 103, the first isolation layer 106, the second isolation layer 108, and the barrier layer 109 are retained.

In summary, in the present embodiment, the sidewall layer covered by the first isolation layer is removed by a plasma process, thereby forming a gap. A process step of sealing the gap is not required, so that the gap has a larger size and high stability, which can effectively reduce the parasitic capacitance of the semiconductor structure.

A second embodiment of the present disclosure provides a semiconductor structure. FIG. 11 is a schematic diagram of the semiconductor structure according to the second embodiment of the present disclosure. Referring to FIG. 11, the semiconductor structure includes: a base 100 with an electrical contact layer 101 therein; an insulating layer 103 located on the base 100, the insulating layer 103 having a conducting layer 111 therein, and the conducting layer 111 being electrically connected to the electrical contact layer 101; and a first isolation layer 106, the first isolation layer being located between the insulating layer 103 and the conducting layer 111, the first isolation layer 106 being also located on part of sidewalls of the insulating layer 103, a gap 107 existing between the insulating layer 103 and the first isolation layer 106, and the gap 107 being sealed by the first isolation layer 106.

A detailed description will be given below in conjunction with the drawings.

Referring to FIG. 11, the base 100 may include structures such as wordlines, bitlines, sources, drains and the like. The base 100 may be made of silicon, sapphire, silicon carbide, gallium arsenide, aluminum nitride, zinc silicon oxide, or the like.

The electrical contact layer 101 is configured to achieve electrical connection between an internal structure of the base 100 and the conducting layer 111. In an example, the conducting layer 111 may be electrically connected to the bitlines in the base 100 through the electrical contact layer 101. In the present embodiment, the electrical contact 101 is made of copper. In other embodiments, the electrical contact layer 101 may also be made of a conducting material, such as polysilicon, tungsten, titanium, or the like.

The base 100 further has isolation structures 102 therein, and the isolation structure 102 is configured to isolate adjacent electrical contact layers 101. In the present embodiment, the isolation structure 102 is made of silicon oxide. In other embodiments, the isolation structure 102 may also be made of an insulating material such as silicon carbide, silicon nitride, or the like.

The insulating layer 103 is configured to isolate adjacent conducting layers 111.

The insulating layer 103 is located on the isolation structure 102, and in a direction parallel to a surface of the base 100, the isolation structure 102 is wider than the insulating layer 103 for the following reason: a gap, a first isolation layer and a second isolation layer will be formed subsequently on a sidewall of the insulating layer 103, the isolation structure 102 is wider than the insulating layer 103, and when a width difference meets a certain value range, the gap, the first isolation layer and the second isolation layer can directly face the isolation structure 102, so that the entire surface of the electrical contact layer 101 is exposed to increase a contact area between the subsequently-formed conducting layer and the electrical contact layer 101, thereby reducing contact resistance.

A width of the insulating layer 103 is greater than or equal to one-half of a width of the isolation structure 102 and less than or equal to the width of the isolation structure 102. When the width of the insulating layer 103 is within the above range, the first isolation layer 106 and the second isolation layer 108 can be well supported and the stability of the semiconductor structure can be improved; and moreover enough space can also be reserved for the gap 107, the first isolation layer 106 and the second isolation layer 108, so that the gap 107, the first isolation layer 106 and the second isolation layer 108 can be located on the isolation structure 102, and the entire surface of the electrical contact layer 101 can be exposed to increase the contact area between the conducting layer 111 and the electrical contact layer 101.

The insulating layer 103 is made of silicon dioxide, silicon nitride, or silicon carbide.

As an interconnection line in the semiconductor structure, the conducting layer 111 connects the structures in the base 100 together according to design requirements to achieve specific functions.

The conducting layer 111 is made of copper, gold, silver, titanium, or tin.

The first isolation layer 106 is configured to seal the gap 107. Since the first isolation layer 106 is also located on the top of the gap 107, the gap 107 does not need other isolation layers for sealing.

The first isolation layer 106 is also located on the isolation structure 102 and exposes the entire surface of the electrical contact layer 101 to increase the contact area between the electrical contact layer 101 and the conducting layer 111 and reduce the contact resistance.

The second isolation layer 108 covers the surface of the first isolation layer 106, and a density of the second isolation layer 108 is greater than that of the first isolation layer 106.

It can be understood that, during the formation of the gap 107, in order to make more ion beams pass through the first isolation layer 106, so that the first isolation layer 106 has a lower density; after the formation of the gap 107, the denser second isolation layer 108 can increase the density of the first isolation layer 106, thereby improving the firmness and stability of the first isolation layer 106.

In a direction parallel to the surface of the base 100, the thickness of the second isolation layer 108 is greater than the thickness of the first isolation layer 106. In this way, the stability of the first isolation layer 106 can be improved, and problems such as collapse of the first isolation layer 106 can be avoided. Preferably, a ratio of the thickness of second isolation layer 108 to the thickness of the first isolation layer 106 is within a range of 1.5:1 to 3:1. When the ratio of the thickness of the second isolation layer 108 to the thickness of the first isolation layer 106 is within the above range, the second isolation layer 108 can well reinforce the first isolation layer 106. In addition, the second isolation layer 108 can occupy a reasonable area on the isolation structure 102, so that the second isolation layer 108 can completely expose the surface of the electrical contact layer 101, so as to increase the contact area between the electrical contact layer 101 and the conducting layer 111.

The first isolation layer 106 and the second isolation layer 108 are both located on the base 100 other than the electrical contact layer 101 and expose the entire surface of the electrical contact layer 101. In this way, the contact area between the conducting layer 111 and the electrical contact layer 101 can be increased, thereby reducing the contact resistance and increasing the operating speed of the semiconductor structure.

In the present embodiment, the first isolation layer 106 is made of silicon dioxide. In other embodiments, the first isolation layer 106 may also be made of a silicon-oxyhydrocarbon. The silicon dioxide or silicon-oxyhydrocarbon is hardly decomposed under the action of oxygen plasma and has good stability.

In the present embodiment, the second isolation layer 108 and the first isolation layer 106 are made of a same material, which can ensure that the second isolation layer 108 and the first isolation layer 106 can be more closely attached, thereby further improving the reinforcement effect of the second isolation layer 108. For example, the second isolation layer 108 and the first isolation layer 106 are both made of silicon dioxide. In other embodiments, the second isolation layer 108 may also be made of a different material from the first isolation layer 106; for example, the second isolation layer 108 may be made of silicon nitride.

In the present embodiment, a width of the gap 107 may be within a range of 1 nm to 5 nm. When the width of the gap 107 is within the above range, the parasitic capacitance can be effectively reduced, and the stability of the first isolation layer 106 and the second isolation layer 108 can be ensured.

In a direction perpendicular to the surface of the base 100, a ratio of a height of the gap 107 to a height of the insulating layer 103 is greater than or equal to 0.3. The height of the gap 107 is within the above range; that is, the gap 107 occupies a large space and can reduce the parasitic capacitance to a great extent.

In one embodiment, in the direction perpendicular to the surface of the base 100, the ratio of the height of the gap 107 to the height of the insulating layer 103 is greater than or equal to 0.9. That is, the contact area between the first isolation layer 106 and the insulating layer 103 is greater than or equal to 0.1 of a total area of the sidewall of the insulating layer 103. If the contact area is within the above range, the first isolation layer 106 can be more closely attached to the sidewall of the insulating layer 103, thereby ensuring that the first isolation layer 106 can completely seal the top of the gap 107, so that the gap 107 has good airtightness and stability. In this way, the parasitic capacitance can be reduced effectively.

The semiconductor structure further includes a barrier layer 109 located between the first isolation layer 106 and the conducting layer 111. In the present embodiment, the barrier layer 109 covers the surface of the second isolation layer 108. The barrier layer 109 is configured to block mutual diffusion between atoms of the conducting layer 111 and atoms in the second isolation layer 108 and increase the adhesion between the barrier layer 109 and the second isolation layer 108.

In the present embodiment, the barrier layer 109 also covers the surface of the electrical contact layer 101. The barrier layer 109 is also configured to block the mutual diffusion between the atoms in the conducting layer 111 and atoms in the electrical contact layer 101 and increase the adhesion between the barrier layer 109 and the electrical contact layer 101.

The barrier layer 109 is made of tantalum, tantalum nitride, ruthenium, or rhenium.

In summary, in the present embodiment, the first isolation layer 106 completely seals the gap 107, so that the gap 107 has good airtightness and stability, which can effectively reduce the parasitic capacitance.

The ordinary skills in the art can understand that the implementations described above are particular embodiments for implementing the present disclosure. In practical uses, various changes in forms and details may be made to the implementations without departing from the spirit and scope of the present disclosure. Any person skilled in the art may make their own changes and modifications without departing from the spirit and scope of the present disclosure. Therefore, the protection scope of the present disclosure shall be subject to the protection scope of the claims.

What is claimed is:

1. A manufacturing method of a semiconductor structure, comprising:
   providing a base with an electrical contact layer therein;
   forming an insulating layer on the base, the insulating layer having a through hole penetrating the insulating layer, and the through hole exposing a surface of the electrical contact layer;
   forming a sidewall layer on a sidewall of the through hole;
   forming a first isolation layer, the first isolation layer covering a surface of the sidewall layer and an exposed surface of the insulating layer;
   removing the sidewall layer to form a gap between the first isolation layer and the insulating layer;
   forming a second isolation layer on a surface of the first isolation layer, a density of the second isolation layer being greater than that of the first isolation layer, wherein the second isolation layer consists of silicon dioxide or silicon nitride; and
   forming a conducting layer filling the through hole, the conducting layer being electrically connected to the electrical contact layer.

2. The manufacturing method of a semiconductor structure according to claim 1, wherein a method for removing the sidewall layer comprises:
   providing a plasma source, causing an ion beam generated by the plasma source to react with the sidewall layer after passing through the first isolation layer and form reaction byproducts, and discharging at least part of the reaction byproducts through the first isolation layer.

3. The manufacturing method of a semiconductor structure according to claim 2, wherein the process step of removing the sidewall layer comprises: generating the ion beam based on an oxygen plasma source, wherein a flow rate of oxygen is within a range of 100 sccm to 600 sccm, and a radio frequency power is within a range of 500 W to 1000 W.

4. The manufacturing method of a semiconductor structure according to claim 1, wherein the sidewall layer is made of amorphous carbon, hydrocarbon or a polymer.

5. The manufacturing method of a semiconductor structure according to claim 1, wherein a top surface of the sidewall layer is lower than a top surface of the insulating layer, and the step of forming the sidewall layer comprises: forming an initial sidewall layer on a surface of the insulating layer and a bottom of the through hole; and removing the initial sidewall layer located at the bottom of the through hole and the top surface of the insulating layer, and further removing a part of the initial sidewall layer located on the sidewall of the through hole, the remaining initial sidewall layer serving as the sidewall layer.

6. The manufacturing method of a semiconductor structure according to claim 5, wherein in a direction perpendicular to a surface of the base, a ratio of a height of the sidewall layer to a height of the insulating layer is greater than or equal to 0.3.

7. The manufacturing method of a semiconductor structure according to claim 1, subsequent to the formation of the conducting layer, further comprising a step of planarization to remove part of the conducting layer, part of the insulating layer, part of the first isolation layer and part of the second isolation layer which are higher than the gap.

8. The manufacturing method of a semiconductor structure according to claim 1, wherein a method for forming the first isolation layer comprises: a low-temperature atomic layer deposition process.

9. The manufacturing method of a semiconductor structure according to claim 1, wherein the first isolation layer is made of silicon dioxide or silicon-oxyhydrocarbon.

10. The manufacturing method of a semiconductor structure according to claim 1, prior to the step of forming the conducting layer filling the through hole, further comprising a step of removing the first isolation layer and the second isolation layer located at a bottom of the through hole and a top surface of the insulating layer; and depositing a barrier layer covering the sidewall of the through hole.

* * * * *